United States Patent
Hsieh et al.

(10) Patent No.: US 8,160,516 B2
(45) Date of Patent: Apr. 17, 2012

(54) LOW FLICKER NOISE ACTIVE MIXER AND METHOD THEREOF

(75) Inventors: Hong Yean Hsieh, Kaohsiung (TW); Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 795 days.

(21) Appl. No.: 12/179,540

(22) Filed: Jul. 24, 2008

(65) Prior Publication Data

US 2009/0029668 A1 Jan. 29, 2009

Related U.S. Application Data

(60) Provisional application No. 60/951,945, filed on Jul. 25, 2007.

(51) Int. Cl.
*H04B 1/04* (2006.01)
(52) U.S. Cl. .......................... 455/118; 455/313; 455/323
(58) Field of Classification Search .................. 455/118, 455/313–333; 327/357–359
See application file for complete search history.

(56) References Cited

U.S. PATENT DOCUMENTS

| 3,241,078 | A | 3/1966 | Jones |
| 6,850,753 | B2 | 2/2005 | Zhang |
| 6,865,382 | B2 | 3/2005 | Behzad |
| 7,107,025 | B2 * | 9/2006 | Khorram ..................... 455/118 |
| 2008/0268805 | A1 * | 10/2008 | Hsieh et al. .................. 455/293 |

OTHER PUBLICATIONS

Behzad Razavi, "Design of Analog CMOS Integrated Circuits", 2001, pp. 314-324, McGraw-Hill, New York.
Behzad Razavi, "RF Microelectronics", 1998, p. 185, Prentice Hall PTR.

* cited by examiner

*Primary Examiner* — Lana N Le
(74) *Attorney, Agent, or Firm* — Thomas, Kayden, Horstemeyer & Risley, LLP

(57) ABSTRACT

A low flicker noise active mixer comprises a trans-conductance section, a switching quad, and a load section. The trans-conductance section converts a voltage signal pair into a first current signal pair. The switching quad converts the first current signal pair into a second signal pair in a manner controlled by a LO (local oscillator) signal pair. The load section provides a loading to the second current signal pair using a pair of commutative active loads to convert the second current signal pair into an output voltage signal pair.

23 Claims, 5 Drawing Sheets

LOW FLICKER NOISE ACTIVE MIXER AND METHOD THEREOF

CROSS REFERENCE TO RELATED APPLICATIONS

This application claims the benefit of U.S. Provisional Application No. 60/951,945, filed on Jul. 25, 2007 and entitled "LOW FLICKER NOISE ACTIVE MIXER AND METHOD THEREOF", the contents of which are incorporated herein by reference.

BACKGROUND OF THE INVENTION

1. Field of the Invention

The present is related to mixer in general, in particular to low flicker noise mixer.

2. Description of Related Art

Mixers are an important circuit for radio frequency (RF) transmitters and receivers. The function of a mixer is to perform a frequency translation. While the present invention is generally related to and applicable to a variety of RF transmitters and receivers. In a direct-conversion receiver, a mixer is used to convert an RF signal into a baseband signal by mixing the RF signal with a clock signal, which is usually referred to as a local oscillator (LO) signal. The frequency of the LO signal is nominally the same as the center frequency of the RF signal, and consequently the resultant baseband signal is centered at DC. In a twist known as a low-IF (intermediate frequency) receiver, which is also highly relevant to the present invention, the frequency of the LO signal is slightly different from the center frequency of the RF signal, and consequently the resultant baseband signal is centered at a low intermediate frequency.

There are numerous topologies to construct a mixer circuit. A topology of particular relevance to the present invention is generally known as "Gilbert-cell," which was taught by Gilbert in U.S. Pat. No. 3,241,078. FIG. 1A depicts a prior art Gilbert-cell mixer 100A comprising: a trans-conductance section comprising a pair of NMOS (N-channel metal-oxide semiconductor) field-effect transistors M1 and M2 for receiving an input voltage signal pair VI+ and VI− and converting the voltage signal pair into a first current signal pair I1 and I2; a switching quad 120 comprising four NMOS field-effect transistors M3, M4, M5, and M6 for commutating the first current signal pair I1 and I2 into a second current signal pair I3 and I4 in a matter controlled by a pair of complementary LO (local oscillator) signals LO+ and LO−; and a load section 130A comprising a resistor pair R1 and R2 for converting the second current signal pair I3 and I4 into an output signal pair VO+ and VO−. Throughout this disclosure, VDD denotes a first supply voltage, and VSS denotes a second supply voltage that is usually a few volts lower than VDD. The principle of Gilbert-cell mixer 100A is well known to those of ordinary skill in the art and well described in numerous publications (e.g. in RF Microelectronics by Behzad Razavi, Prentice Hall PTR, 1998, page 185), and is thus not described in detail here. In an alternative embodiment, the sources of M1 and M2 are coupled to a current source (not shown in the figure) instead of being directly tied to VSS.

A drawback in embodiment 100A is that the two load resistors R1 and R2 usually occupy considerable voltage headroom and thus adversely limit the available voltage swing for the output signal.

In an alternative embodiment 100B depicted in FIG. 1B, a different load section 130B is used. Here, the load section 130B comprises a pair of VCCS (voltage-controlled current sources) CS1 and CS2 forming a pair of active loads for the second current signal pair I3 and I4. Embodiment 100B further comprises a CMFB (common-mode feedback) circuit 140 for receiving the output voltage signal pair VO+ and VO− and a common-mode reference voltage VCM and generates a feedback voltage signal VFB accordingly to control CS1 and CS2. The function of the CMFB circuit 140 is to generate the feedback voltage signal VFB to control CS1 and CS2 in a closed loop manner such as to force the mean value of VO+ and VO− to approach the reference voltage VCM. The principle of common-mode feedback and circuit implementation are well known to those of ordinary skills in the art and well described in numerous literatures (e.g. in Design of Analog CMOS Integrated Circuits by Behzad Razavi, McGraw-Hill, New York, 2001, pages 314-324). Embodiment 100B usually allows greater voltage swing for the output signal, compared to the case in FIG. 1A where resistors R1 and R2 are used. In the applications of interest, a current source is embodied using a transistor. In a typical case for the mixer in FIG. 1B, each of CS1 and CS2 is embodied by a PMOS (P-type MOS) field-effect transistor. A MOS field-effect transistor always generates a type of low-frequency noise known as flicker noise. Therefore, CS1 and CS2 will generate a flicker noise, which is directly imposed onto the output voltage signal pair VO+ and VO−. The flicker noise is highly undesirable, in particular for a direct-conversion receiver, since the output signal contains some low frequency components that will likely be corrupted by a low-frequency noise.

What is needed is a Gilbert-cell mixer that has a load section that does not occupy considerable voltage headroom yet does not contribute flicker noise to the output.

BRIEF SUMMARY OF THIS INVENTION

In an embodiment, a mixer circuit is disclosed, the mixer circuit comprising: a trans-conductance section for converting an input voltage signal pair into a first current signal pair; a switching quad for converting the first current signal pair into a second current signal pair in a manner controlled by a LO (local oscillator) signal pair; a load section comprising a commutative voltage-controlled current source pair, whose commutation is controlled by a complementary logical signal pair, for providing a commutative loading to the second current signal pair to convert the second current signal pair into an output voltage signal pair; and a common-mode feedback circuit for receiving the output voltage signal pair and a reference voltage and generate accordingly a feedback voltage signal to control the voltage-controlled current source pair.

In an embodiment, a method of processing an input voltage signal pair is disclosed, the method comprising: converting the input voltage signal pair into a first current signal pair using a trans-conductance section; converting the first current signal pair into a second current signal pair using a switching quad controlled by a LO (local oscillator) signal pair; providing a loading section to the second current signal pair to convert the second current signal pair into an output voltage signal pair using a commutative voltage-controlled current source pair; controlling the commutation of the commutative voltage-controlled current source pair using a complementary logical signal pair; generating a control voltage for the commutative voltage-controlled current source pair using a common-mode feedback circuit to force the mean value of the output voltage signal pair to approach a reference voltage.

DETAILED DESCRIPTION OF THIS INVENTION

The present invention relates to a mixer circuit. While the specifications described several example embodiments of the invention considered best modes of practicing the invention, it should be understood that the invention can be implemented in many way and is not limited to the particular examples described below or to the particular manner in which any features of such examples are implemented. In other instances, well-known details are not shown or described to avoid obscuring aspects of the invention.

Figure 2:
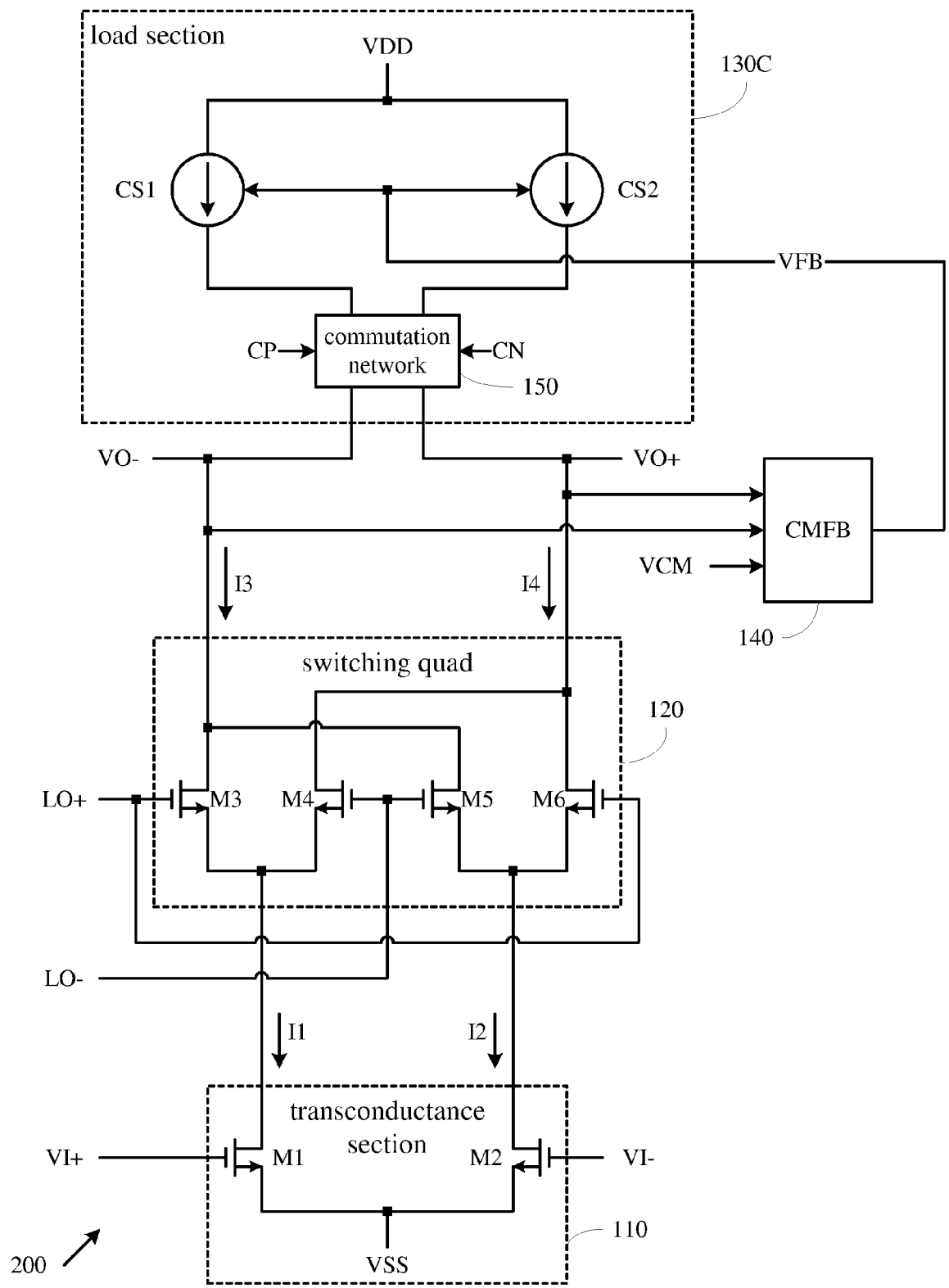
FIG. 2 shows an exemplary mixer circuit in accordance with the present invention.

A mixer 200 in accordance with the present invention is depicted in FIG. 2. Mixer 200 comprises: a trans-conductance section comprising a pair of NMOS (N-channel metal-oxide semiconductor) field-effect transistors M1 and M2 for receiving an input voltage signal pair VI+ and VI− and converting the voltage signal pair into a first current signal pair I1 and I2; a switching quad comprising four NMOS field-effect transistors M3, M4, M5, and M6 for commutation the first current signal pair I1 and I2 into a second current signal pair I3 and I4 in a matter controlled by a pair of complementary LO (local oscillator) signals LO+ and LO−; and a load section 130C for converting the second current signal pair 13 and 14 into an output voltage signal pair VO+ and VO−. Mixer 200 further comprises a CMFB (common-mode feedback) circuit 140 for receiving the output voltage signal pair VO+ and VO− and a common-mode reference voltage VCM and generates a feedback voltage signal VFB accordingly. Load section 130C comprises a pair of VCCS CS1 and CS2 controlled by the feedback voltage signal VFB and a commutation network 150. The commutation network 150 provides a commutative coupling between the VCCS pair (i.e. CS1 and CS2) and the output voltage signal pair (i.e. VO+ and VO−) in a manner controlled by a pair of complementary logical signals CP and CN.

Figure 1A:
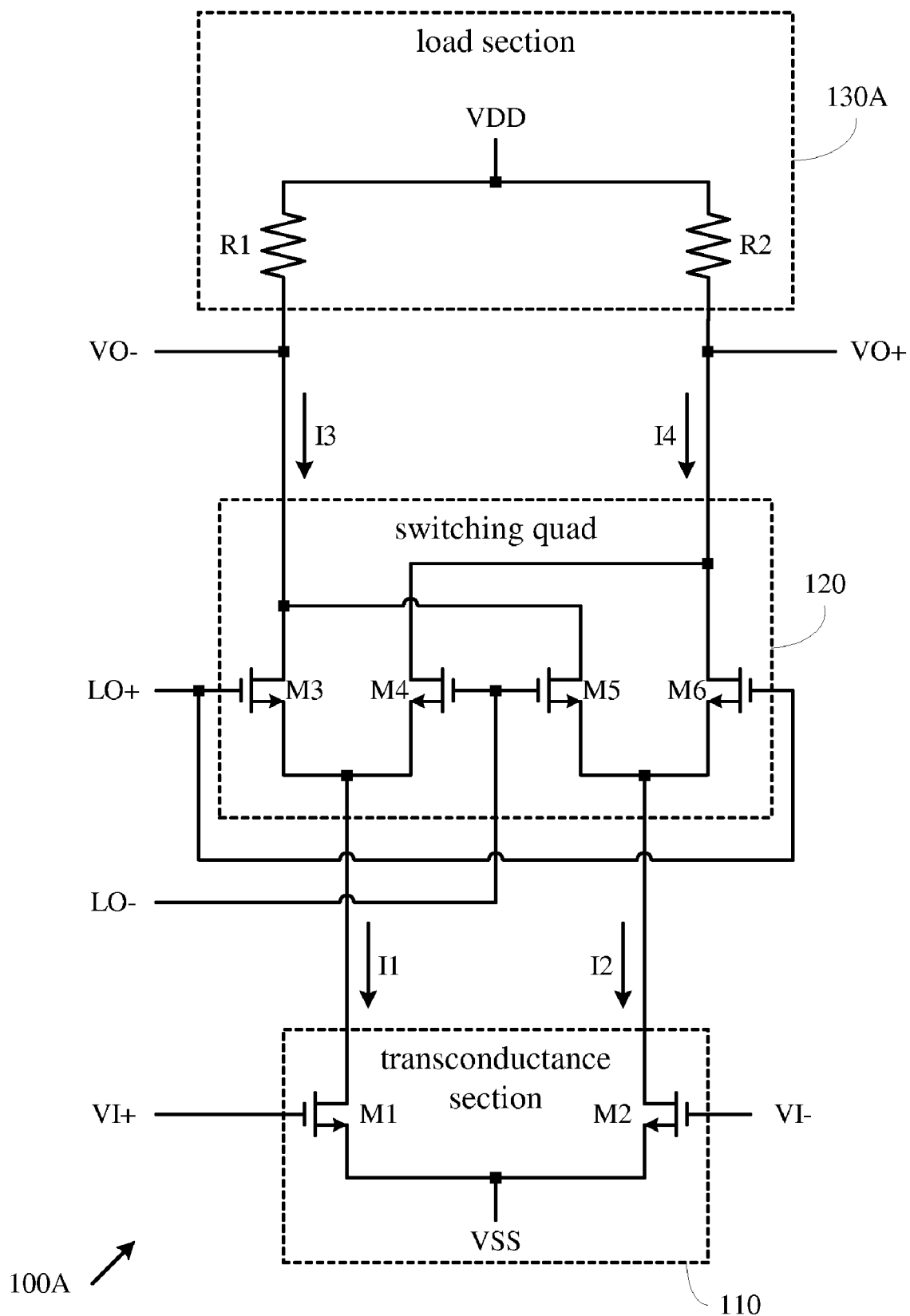
FIG. 1A shows a prior art Gilbert-cell mixer.
Figure 1B:
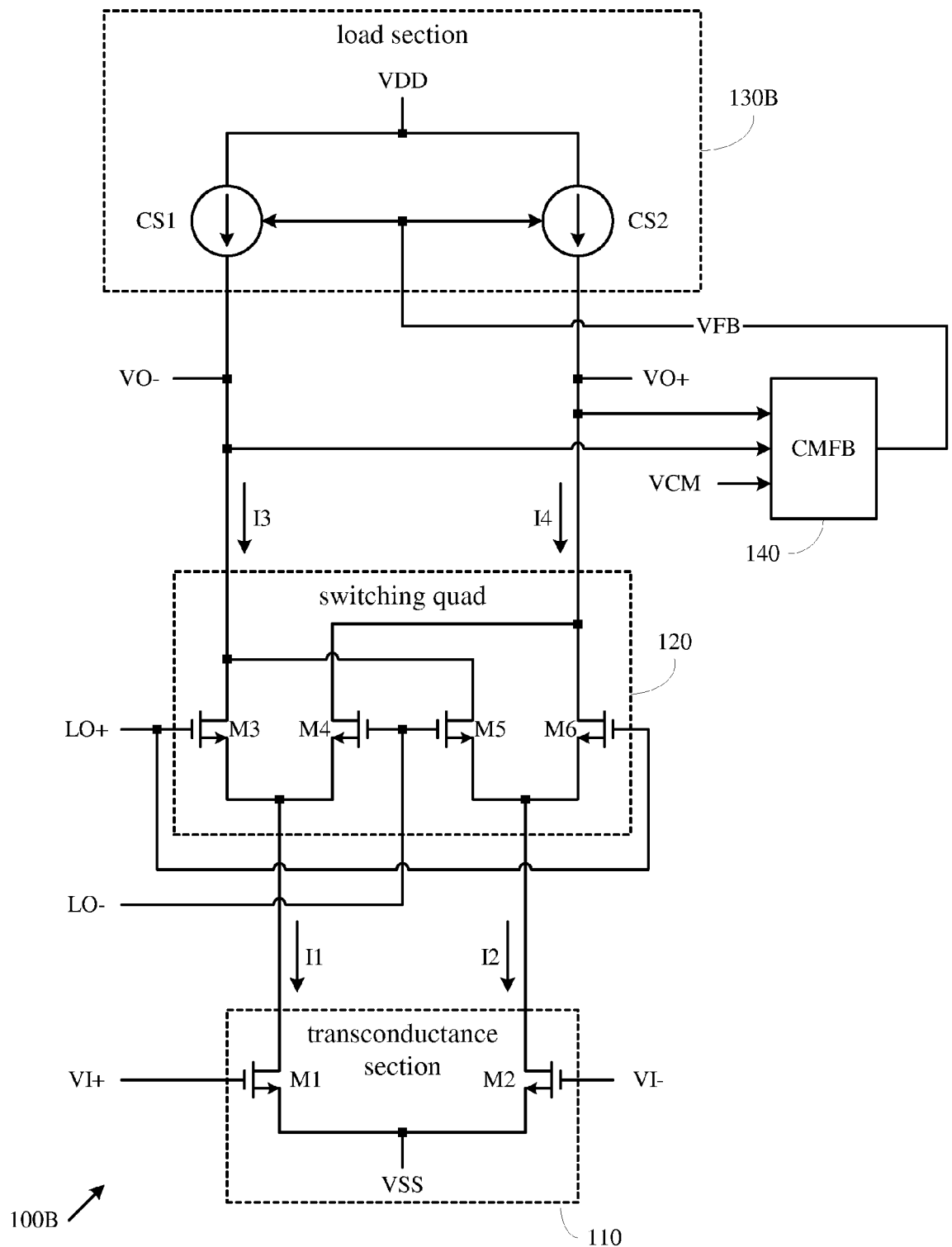
FIG. 1B shows an alternative prior art Gilbert-cell mixer.

The general principle of frequency translation of the mixer 200 of FIG. 2 is the same as that of the prior art mixer 100B of FIG. 1B and thus not described in detail here. The innovation of the present invention lies in the method and apparatus of providing a commutative loading for the second pair of current signal I3 and I4 using the commutation network 150 such that the loading section 130C does not occupy considerable voltage headroom and also do not contribute flicker noise. The principle is explained as follows. The commutation network 150 is controlled by the logical signals CP and CN, which are complementary, i.e. CP is a logical inversion of CN. When CP is asserted and therefore CN is de-asserted, CS1 is coupled to VO+ and CS2 is coupled to VO−; when CP is de-asserted and therefore CN is asserted, CS1 is coupled to VO− and CS2 is coupled to VO−. Both CS1 and CS2 generate flicker noise and pass that noise to the output voltage signal pair VO+ and VO−. The effective noise at the differential output, i.e. VO+ minus VO−, is then the flicker noise (generated by CS1 and CS2) multiplied by either 1 or −1, depending on the state of the complementary logical signal pair CP and CN. This effectively modulates the flicker noise using the complementary logical signal CN and CP. In a preferred embodiment, CP and CN are a pair of complementary clock signals whose frequency is higher than the frequency of the signal of interest at the mixer output. In this case, the flicker noise generated by the current sources CP and CS are modulated and appears at the output as an out-of-band noise, which does not degrade the integrity of the signal of interest. By properly setting the common-mode reference voltage VCM, one can also ensure the load section 130C does not occupy considerable voltage headroom.

Note that the commutation network 150 can be implemented using exactly the same circuit configuration of the switching quad 120, only that the controlling signal pair is CP and CN, instead of LO+ and LO−.

Figure 3:
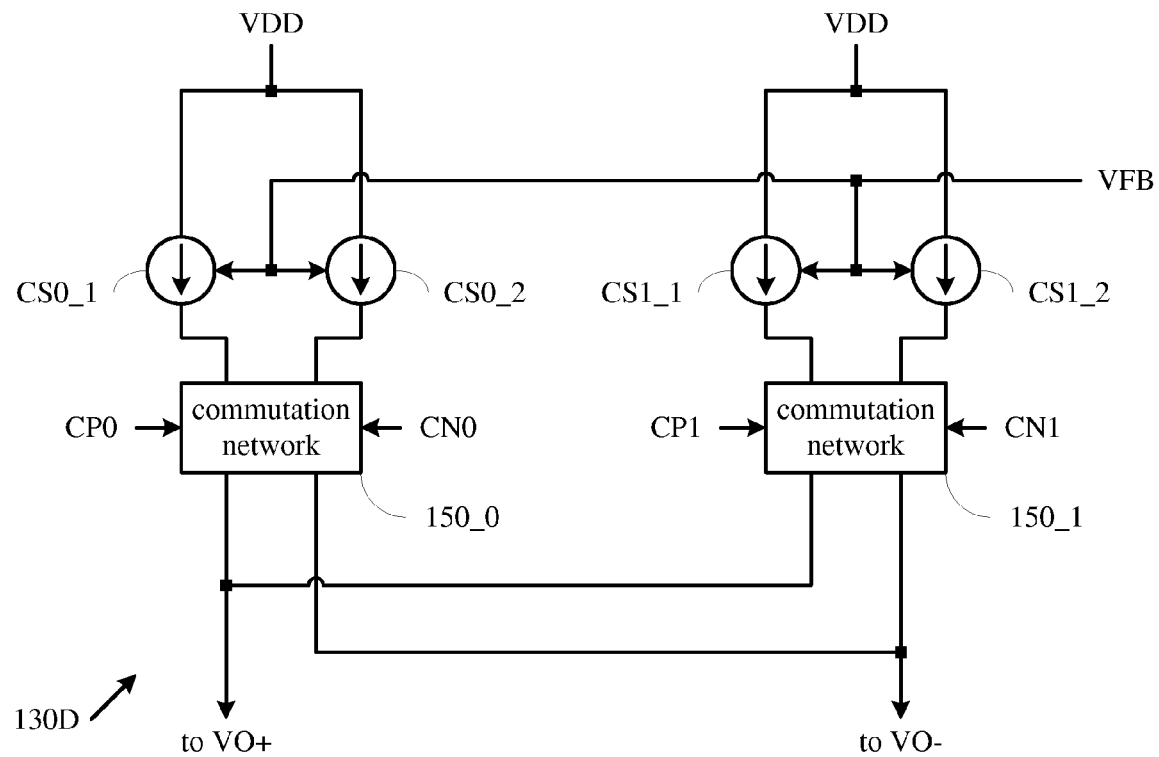
FIG. 3 shows an alternative embodiment for the load section for the mixer circuit of FIG. 2.
Figure 4:
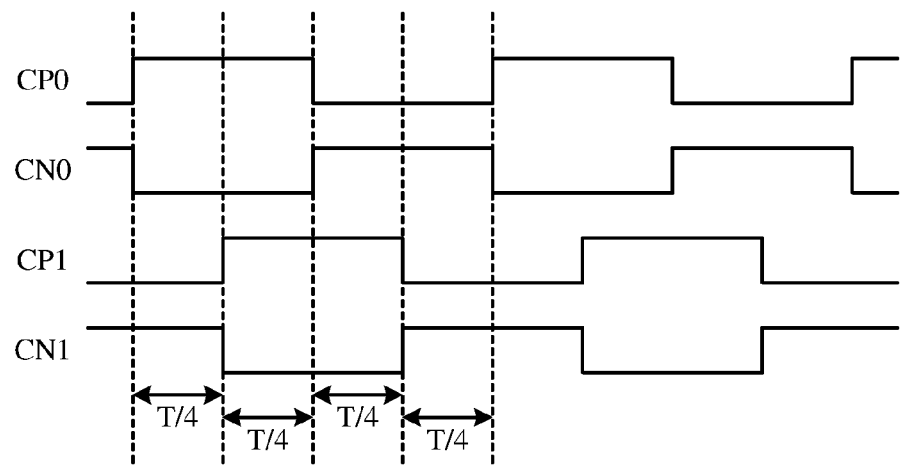
FIG. 4 shows a timing diagram for the controlling signals for the load section of FIG. 3.

Mixer 200 of FIG. 2, however, has a drawback that, a glitch occurs whenever the complementary logical signal pair CP and CN toggles its state. This drawback can be alleviated by using an alternative load section 130D depicted in FIG. 3 to replace the load section 130C in mixer 200 of FIG. 2. In load section 130D, one uses a plurality of current source pairs to couple to VO+ and VO−⁻ via a plurality of commutation networks controlled by a plurality of complementary logical signal pairs, respectively. By way of example but not limitation, FIG. 300 shows two current source pairs (CS0_1-CS0_2 and CS 1_1-CS 1_2) that couple to VO+ and VO− via two commuting networks (150_0 and 150_1) controlled by two complementary logical signal pairs (CP0-CN0 and CP1-CN1), respectively. Each current source pair consists of two current sources that inject substantially the same amount of current. One has to properly choose the amount of currents for those two current source pairs such that the total amount of current provided by those two source pairs equals the amount of current provided by the lone current source pair CS1 and CS2 in FIG. 2. In a preferred embodiment, each of the four current sources in the load section 130D of FIG. 3 injects exactly half of the amount of current injected by each of the two current sources in the load section 130C of FIG. 2. At any time instant, therefore, the total current provided to VO+ (or VO−) by the two current source pairs in FIG. 3 is the same as that provided by the lone current source pair CS1 and CS2 in FIG. 2, regardless of the states of the two complementary logical signal pairs. As a result, the load section 130D in FIG. 3 provides the same loading as the load section 130C in FIG. 2. However, the adverse effect of glitch can be alleviated by properly arranging the timings of the first complementary logical signal pair CP0 and CN0 and the timings of the second complementary logical signal pair CP1 and CN1. In a preferred embodiment, CP0, CP1, CN0, and CN1 are constructed from a four-phase clock illustrated by a timing diagram shown in FIG. 4. Here, T denotes a clock period. Per this arrangement, the first VCCS pair (CS0_1 and CS0_2) and the second VCS pair (CS1_1 and CS1_2) commutate in a time-interleaved manner. Each time a VCCS pair commutates, only 50% of the total load current is commutated. The effect of each glitch, therefore, is lessened by 50%. The same idea can be generalized to using N VCCS pairs and N commutation networks controlled by N complementary logical signal pairs, respectively, generated from a 2×N-phase clock, where N is any positive integer.

Figure 5:
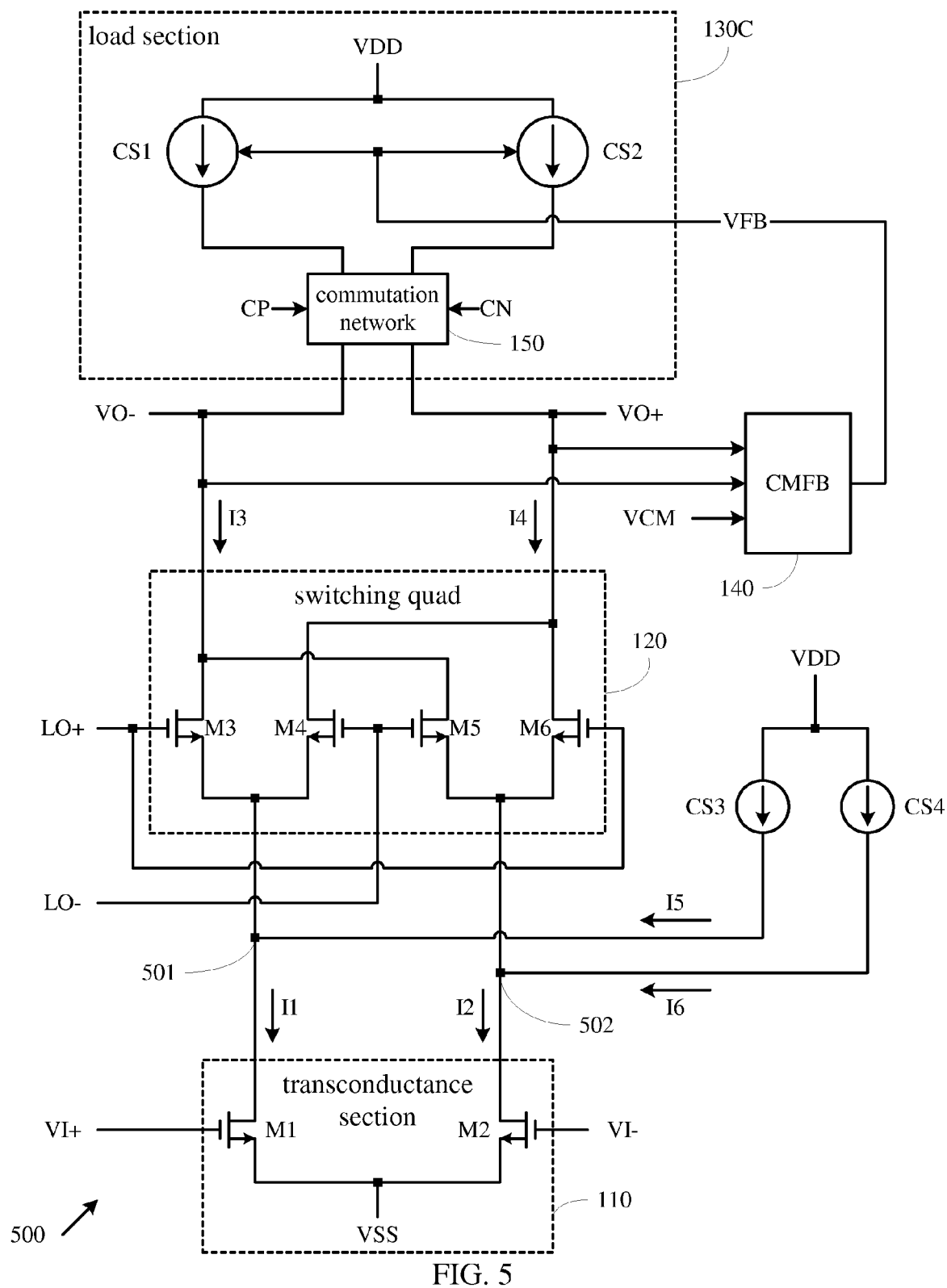
FIG. 5 shows an alternative embodiment in accordance with the present invention.

An alternative mixer 500 that is a slight modification to mixer 200 of FIG. 2 is depicted in FIG. 5. Mixer 500 is exactly the same as mixer 200 except for an additional current source pair CS3 and CS4 that are inserted to inject currents I5 and I6 into circuit nodes 501 and 502, respectively. Due to the introduction of I5 and I6, the currents that flow through the switching quad 120 are reduced. Since the power of the flicker noise generated by a transistor is proportional to the current flowing through the transistor, the power of the flicker noise generated by transistors M3-M6 in the switching quad 120 is also reduced. Therefore, mixer 500 has low flicker noise contribution from the transistors in the switching quad 120, compared to the case in mixer 200. One may choose to replace the load section 130C with the load section 130D of FIG. 3 to reduce the glitch of the load section.

In MOS technologies, a voltage-controlled current source can be conveniently implemented by using a MOS transistor whose gate is coupled to a controlling voltage signal. A current source can be conveniently implemented by using a MOS transistor whose gate is coupled to a fixed bias voltage. A switch can be conveniently implemented by using a MOS transistor, P-type or N-type, whose gate is coupled to a voltage that is either high enough or low enough to turn on the particular MOS transistor. These are all deemed well known to those of ordinary skills in the art and thus not described in details to avoid obscuring the aspects of the invention.

Alternative Embodiments

Those of ordinary skill in the art can practice the principle disclosed by the current invention in various alternative forms. For example:

1. One can use PMOS (P-type metal-oxide semiconductor) transistors instead of NMOS transistors for the trans-conductance section 110 or switch section 120, or both. To those of ordinary skills in the art, it is straightforward to construct a functionally equivalent PMOS based circuit from a NMOS based circuit and therefore no detailed descriptions are given here.
2. One can use other semiconductor devices than MOS devices. For example, BJT (bipolar junction transistor), HBT (hetero-junction bipolar transistor), and so on. Those of ordinary skill in the art know how to implement a trans-conductance device, a switch device, and a current source in those alternative semiconductor devices and thus no detail is shown here.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A mixer circuit comprising:
   a trans-conductance section for converting an input voltage signal pair into a first current signal pair;
   a switching circuit for converting the first current signal pair into a second current signal pair according to a LO (local oscillator) signal pair; and
   a load section commutated under a control of a first complementary logical signal pair, for providing a first commutative loading to the second current signal pair to convert the second current signal pair into an output voltage signal pair.

2. The mixer circuit of claim 1, further comprising:
   a common-mode feedback circuit for receiving the output voltage signal pair and a reference voltage and generate accordingly a feedback voltage signal to control the first commutative voltage-controlled current source pair.

3. The mixer circuit of claim 1, wherein a frequency of the first complementary logical signal pair is higher than that of a component of interest in the output voltage signal pair.

4. The mixer circuit of claim 1, the load section comprising a first commutative voltage-controlled current source pair commutated under a control of the first complementary logical signal pair.

5. The mixer circuit of claim 4, wherein the load section further comprises at least a second commutative voltage-controlled current source pairs commutated under a control of a second complementary logical signal pair, for providing a second commutative loading to the second current signal pair.

6. The mixer circuit of claim 5, wherein the current values the first and the second commutative voltage-controlled current source pairs are substantially the same.

7. The mixer circuit of claim 5, wherein the first complementary logical signal pair and the second complementary signal pair are generated in accordance with a multi-phase clock of a frequency higher than that of a component of interest in the output voltage signal pair.

8. The mixer circuit of claim 5, wherein the first complementary logical signal pair and the second complementary logical signal pair have the same frequency but differential phases.

9. The mixer circuit of claim 4, the load section further comprising:
   a commutation network, coupled to the first commutative voltage-controlled current source pair and the switching circuit, configured to adjust the connection relationship between the first commutative voltage-controlled current source pair and the switching circuit.

10. The mixer circuit of claim 1, wherein a flicker noise generated by the mixer circuit is modulated into an out-of-band noise in the output voltage signal pair due to the commutation.

11. The mixer circuit of claim 1, further comprising:
    a current source pair, coupled to the trans-conductance section, configured to inject an additional current into the trans-conductance section.

12. A method of processing an input voltage signal pair, the method comprising: converting the input voltage signal pair into a first current signal pair;
    converting the first current signal pair into a second current signal pair by performing a commutation in accordance with a LO (local oscillator) signal pair;
    providing a loading to the second current signal pair to convert the second current signal pair into an output voltage signal pair using at least one commutative voltage-controlled current source pair; and
    controlling the commutation of the at least one commutative voltage-controlled current source pair using at least one respective complementary logical signal pair.

13. The method of claim 12, further comprising:
    generating a control voltage to force a mean value of the output voltage signal pair to approach a reference voltage.

14. The method of claim 12, wherein a frequency of the at least one complementary logical signal pair is higher than that of a component of interest in the output voltage signal pair.

15. The method of claim 12, wherein the at least one complementary logical signal pair is generated in accordance with a multi-phase clock signal.

16. The method of claim 12, wherein the at least one complementary logical signal pair has the same frequency and different phases.

17. The method of claim 12, wherein a flicker noise of the output voltage signal pair is modulated into an out-of-band noise in the output voltage signal pair.

18. The method of claim 12, wherein the step of converting the input voltage signal pair into a first current signal pair further comprises: injecting an additional current such that the flicker noise of the output voltage signal pair is reduced.

19. A mixer circuit comprising:
    a converter for converting an input voltage signal pair into a first current signal pair;

a switching circuit for converting the first current signal pair into a second current signal pair according to a LO (local oscillator) signal pair;

a load circuit for providing a loading to the second current signal pair to convert the second current signal pair into an output voltage signal pair; and a commutation network, coupled between the switching circuit and the load circuit, for changing the connection relationship between the switching circuit and the load circuit in accordance with a first complementary logical signal pair.

20. The mixer circuit of claim 19, further comprising:

a common-mode feedback circuit for receiving the output voltage signal pair and a reference voltage and generate accordingly a feedback voltage signal to control the load circuit.

21. The mixer circuit of claim 19, wherein a frequency of the first complementary logical signal pair is higher than that of a component of interest in the output voltage signal pair.

22. The mixer circuit of claim 19, wherein the load circuit further comprises at least a first voltage-controlled current source pairs commutated under a control of the first complementary logical signal pair.

23. The mixer circuit of claim 22, wherein the load circuit further comprises at least a second commutative voltage-controlled current source pairs commutated under a control of a second complementary logical signal pair, for providing a second loading to the second current signal pair.

* * * * *